(12) United States Patent
Burns et al.

(10) Patent No.: US 6,650,163 B1
(45) Date of Patent: Nov. 18, 2003

(54) CLOCK GENERATOR FOR INTEGRATED CIRCUIT

(75) Inventors: Jeffrey L. Burns, Austin, TX (US); Alan James Drake, Ann Arbor, MI (US); Uttam Shyamalindu Ghoshal, Austin, TX (US); Kevin John Nowka, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/216,618

(22) Filed: Aug. 8, 2002

(51) Int. Cl.[7] .................................................. H03K 3/00
(52) U.S. Cl. ...................................... 327/295; 327/304
(58) Field of Search ................................ 327/110, 168, 327/170, 177, 291–293, 295, 296, 304, 239, 256–259

(56) References Cited

U.S. PATENT DOCUMENTS

| | | | | |
|---|---|---|---|---|
| 5,920,235 A | * | 7/1999 | Beards et al. | 331/108 D |
| 6,396,316 B1 | * | 5/2002 | Cruz et al. | 327/112 |
| 6,417,737 B1 | * | 7/2002 | Moloudi et al. | 330/301 |
| 6,462,623 B1 | * | 10/2002 | Horan et al. | 331/17 |
| 6,469,587 B2 | * | 10/2002 | Scoggins | 331/117 R |
| 6,525,571 B2 | * | 2/2003 | Green | 326/115 |

* cited by examiner

*Primary Examiner*—My-Trang Nu Ton
(74) *Attorney, Agent, or Firm*—Joseph P. Lally; Casimer K. Salys

(57) ABSTRACT

A system and integrated circuit (die) including a clock generator that includes an on-chip inductor and uses the inherent capacitance of the load to generate a sinusoidal clock signal. The inductor is connected between a current source and an inverting switch. The output of the switch is a substantially sinusoidal signal that connected directly to at least a portion of the clock driven circuits without intermediate buffering. In the preferred embodiment, the clock generator is a dual phase design that includes a pair of cross-coupled MOSFET's, a pair of solid state on-chip inductors, and a current source. Each of the on-chip inductors is connected between the current source and the drain of one of the MOSFET's. The outputs of the clock generator are provided directly to the clock inputs of at least a portion of the clock driven circuits on the die. In this embodiment, the frequency of the clock generator output signal is predominantly determined by the inductance of the inductive elements and the capacitance of the clock driven circuitry. This design eliminates the need for incorporating distinct capacitor elements in the clock generator itself and produces a clock generator in which a significant portion of the power oscillates between the generator's inductive elements and the capacitive elements of the load thereby reducing the power required to be supplied by the current source.

19 Claims, 4 Drawing Sheets

US 6,650,163 B1

CLOCK GENERATOR FOR INTEGRATED CIRCUIT

BACKGROUND

1. Field of the Present Invention

The present invention generally relates to the field of electronic devices and more particularly to the design of a clock generator circuit for use in a data processing system that generates an oscillating signal based on the capacitance of the clock driven logic on the system.

2. History of Related Art

In the field of electronic devices, clock signals and clock generation circuits are well known. Conventional clock generators can be divided into two broad classes, generators for use in VLSI devices such as general purpose microprocessors and digital signal processors and generators for use in consumer electronic devices such as cell phones. Referring to FIG. 1, an exemplary VLSI-type generator 104 is shown as part of a VLSI device 101. VLSI device 101 comprises a single device fabricated on a monolithic substrate such as a silicon substrate. Device 101 includes a clock generator circuit 104, buffering circuitry 106, and functional logic collectively identified as load 110. VLSI device 101 typically receives an input from an external clock device 102 such as a crystal. Device 101 includes some form of clock generation circuit 104 such as a phase-locked loop or delay-locked loop that attempts to minimize the variation in frequency and/or phase in the on-chip clock. The output of the clock generator 104 is then typically amplified or buffered by buffering circuitry 106. The output of buffering circuitry 106 drives the functional logic (load 110) of device 101.

Referring to FIG. 2, an exponential horn implementation of buffering circuit 106 is shown. In this depiction, buffering circuitry 106 includes a series of conventional CMOS inverters 120. The size (measured as the ratio of the transistor's width to length (W/L)) of each successive inverter is some geometric factor larger than the size of the preceding inverter.

Historically, the frequency of the clock signal provided to load 110 has been in the tens to hundreds of megahertz range. At such frequencies, the stray capacitance associated with load 110 is not sufficient to alter the shape of the clock signal significantly and the clock signal is therefore substantially square. Square wave signals are generally desirable as clocking signals in CMOS devices because the rapidity with which such signals transition between states beneficially reduces the CMOS crossover current and minimizes problems associated with intra-device variations in threshold voltage.

As circuits have advanced, however, it has become increasing problematic to generate square wave clock signals. The high frequency components required to generate good square waves are drastically attenuated by the stray capacitance associated with any semiconductor device. Manufacturers have been generally more successful in increasing the clocking frequency than they have been in reducing stray capacitance with the result being that it is increasingly difficult to generate square waves. This problem has motivated designers to consider the effects of a clock signal having rise and fall times that are relatively slow compared to a square wave.

Consumer electronic circuits, on the other hand, have typically implemented simpler and lower cost clock generators. These circuits most commonly incorporate some form of tank circuit in which an LC combination produces a substantially sinusoidal signal. This signal is buffered up and provided to the device's functional circuitry.

While VLSI clock generators are generally superior to consumer electronic signal generators in terms of quality and tuning range, they require an external clock signal and tend to consume an undesirable amount of power in the buffering circuitry. While consumer product clock circuits have the advantage of being inexpensive, they have generally been unsuitable for VLSI devices because of the slow rise times and because, at historical clock frequencies, it has been impractical to design inductors and capacitors of sufficient size. (The characteristic frequency of an LC circuit is inversely proportional to the root of the LC product).

It would be desirable to implement a clock generation circuit for a VLSI device that incorporated the advantages of the consumer product clock generators without unduly comprising the quality of the clock signal and without producing a die size that is impractical.

SUMMARY OF THE INVENTION

The problems identified above are in large part addressed by a system and integrated circuit (die) including a clock generator in which an on-chip inductive element is connected between a current source and an inverting switch. The output of the switch is a substantially sinusoidal signal that is suitable for driving or clocking at least a portion of the clock driven circuits without intermediate buffering. In the preferred embodiment, the clock generator is a dual phase design that includes a pair of cross-coupled MOSFET's, a pair of solid state on-chip inductors, and a current source. Each of the on-chip inductors is connected between the current source and the drain of one of the MOSFET's. The outputs of the clock generator are provided directly to the clock inputs of at least a portion of the clock driven circuits on the die. In this embodiment, the frequency of the clock generator output signal is predominantly determined by the inductance of the inductive elements and the capacitance of the clock driven circuitry. This design eliminates the need for incorporating distinct capacitor elements in the clock generator itself and produces a clock generator in which a significant portion of the power oscillates between the generator's inductive elements and the capacitive elements of the load thereby reducing the power required to be supplied by the current source.

BRIEF DESCRIPTION OF THE DRAWINGS

Other objects and advantages of the invention will become apparent upon reading the following detailed description and upon reference to the accompanying drawings in which.

Figure 1:
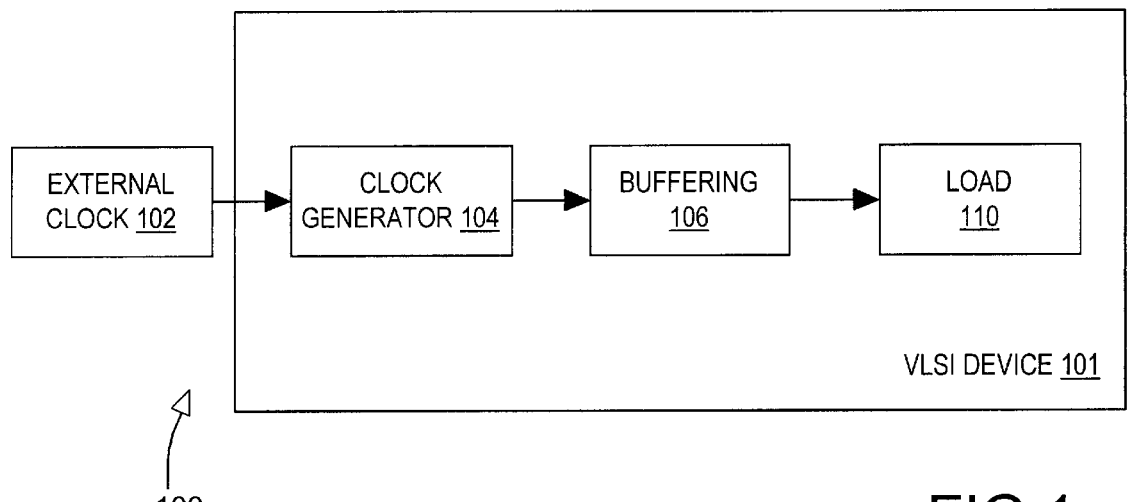
FIG. 1 is a block diagram of selected elements of a clock generator circuit according to the prior art.

While the invention is susceptible to various modifications and alternative forms, specific embodiments thereof are shown by way of example in the drawings and will herein be described in detail. It should be understood, however, that the drawings and detailed description presented herein are not intended to limit the invention to the particular embodiment disclosed, but on the contrary, the intention is to cover all modifications, equivalents, and alternatives falling within the spirit and scope of the present invention as defined by the appended claims.

DETAILED DESCRIPTION OF THE INVENTION

Generally speaking, the present invention contemplates an integrated circuit, also referred to herein as a device or a die, that includes an on-chip clock generator for a VLSI device such as a general purpose microprocessor or digital signal processor. In one embodiment, the clock generator circuit includes at least one solid state inductor, but dispenses with the capacitor element typical of conventional LC tank circuits. Instead, the capacitance inherent in the circuits driven by the clock generator provides the generator's capacitive element. In another embodiment, the inherent device capacitance is supplemented with a discrete capacitor comprising a portion of the generator circuit.

The output of the clock generator is connected directly to clock inputs of the clock-driven circuits. In this design, energy oscillates between the clock generator's inductor(s) and the stray capacitance of the clock-driven circuits. Buffering circuits, which dissipate significant energy in a conventional VLSI clock generator, are not used.

Figure 3:
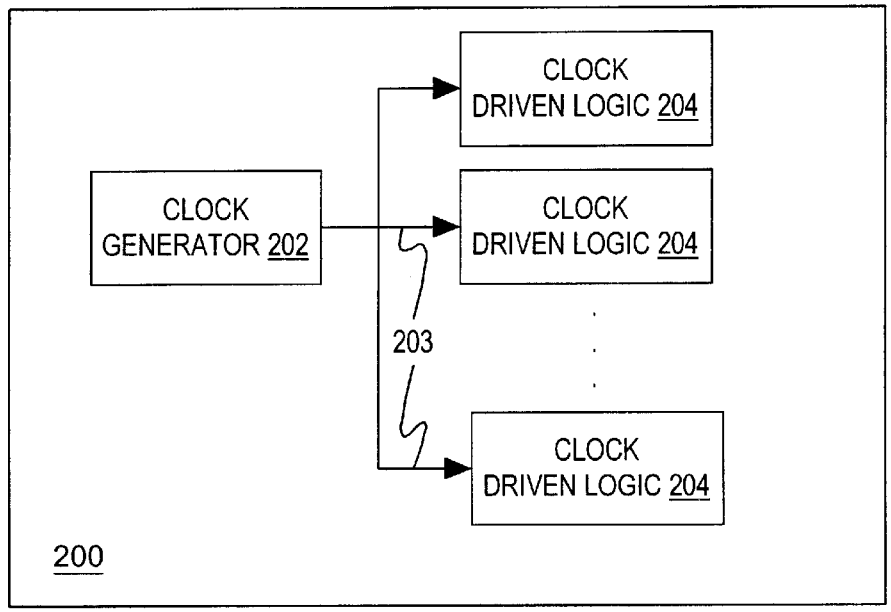
FIG. 3 is a block diagram of selected elements of an integrated circuit or electronic device emphasizing according to one embodiment of the present invention.

Turning now to the drawings, FIG. 3 is a block diagram of selected elements of an integrated circuit 200. In this depiction, integrated circuit 200 is illustrated as comprising an on-chip clock generator 202 and a set of clock-driven circuits or logic identified by reference numerals 204. Clock driven logic 204 represents logical elements of integrated circuit 200 that receive the clock signal 203 generated by generator 202 or otherwise influence its characteristics. Thus, clock driven logic 204 includes synchronous logic elements, such as conventional flip-flops and combinational gates that employ a clock, such as domino logic gates, as well as the interconnects between generator 202 and the logic elements. In the preferred embodiment of the invention, clock driven logic 204 does not include buffering circuitry such as the buffering circuitry 106 described above with respect to FIG. 1. In other words, one embodiment of integrated circuit 200 contemplates a direct, non-buffered connection between clock generator 202 and clock driven logic 204. Those skilled in the field of electronics and electronic design will appreciate that each element of clock driven logic 204 includes stray or inherent capacitance that loads the output of clock generator 202. Thus, FIG. 3 emphasizes integrated circuit 200 from the perspective of the present invention as primarily comprised of a clock generator and the capacitive load that it drives.

The invention generally makes use of the capacitive load by incorporating it into the design of the clock generator. Typically, the clock generator according to the present invention comprises a modified tank circuit that eliminates or reduces the need for a designed-in capacitive element within the clock generator itself. Instead, an output node of the clock generator is connecting directly to the clock driven logic. In this configuration, the capacitive load influences the output signal in the same manner as a capacitor would if it were deliberately designed into the generator without consuming the space required for a discrete capacitor.

Figure 4:
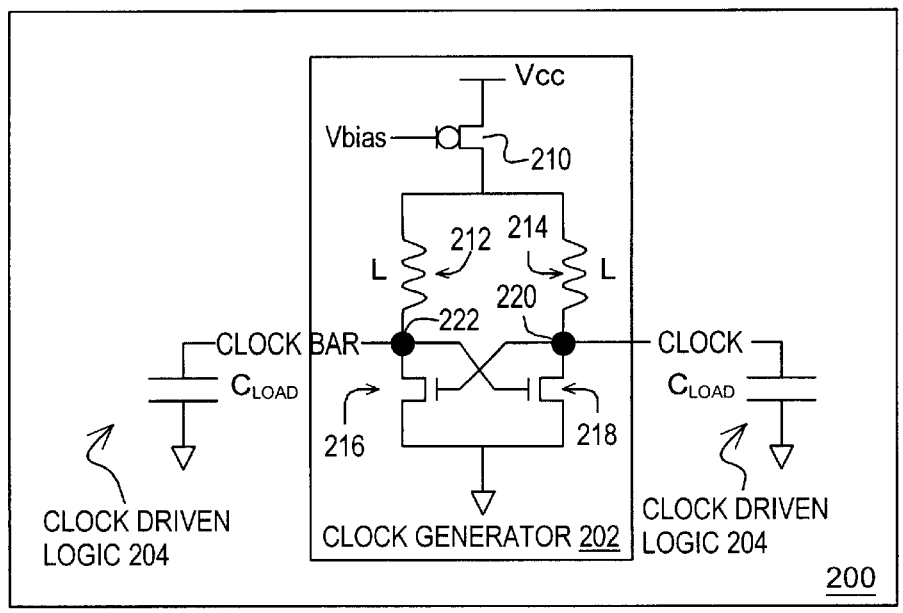
FIG. 4 is a circuit diagram of the clock generator of FIG. 3 according to one embodiment of the invention.

Referring now to FIG. 4, a dual-phase implementation of clock generator circuit 202 according to one embodiment of the invention is depicted. In this embodiment, clock generator 202 includes a pair of inductors 212 and 214 and a corresponding pair of cross-coupled MOSFET devices 216 and 218 that produce dual phase clock signals on nodes 220 and 222 where the phases of the clock signals are 180 degrees apart. Inductor 212 is connected between a current source, in the form of a biased PMOS transistor 210 that is tied to Vcc, and the drain terminal of transistor 216. Inductor 214 is connected between the current source and the drain terminal of transistor 218. The gate of transistors 216 and the drain of transistor 218 are connected to clock generator output node 220 that represents the CLOCK signal. The gate of transistor 218 and the drain of transistor 216 are connected to clock generator output node 222, which represents the CLOCK BAR signal. Output nodes 220 and 222 are connected directly to clock driven logic 204. For purposes of this figure, clock driven logic 204 is represented simply as a capacitor having a capacitance Of $C_{LOAD}$.

As illustrated in FIG. 4 clock generator 202 operates as an LC circuit where the capacitance is provided by the clock generator's load. Those knowledgeable in circuit design will appreciate that the CLOCK and CLOCK BAR signal are substantially sinusoidal. Although square signal clocks are preferable to sine waves because of their smaller skew times and reduce cross-over currents, even conventional clock generator circuits are increasingly unable to deliver substantially square signals because the pace at which clock frequencies have increased has outpaced the rate at which semiconductor manufacturers have been able to decrease the capacitive loading within the devices. Faced with the reality of increasingly "non-square" clock signals, circuit designers are already required to design circuits that are immune to somewhat slower rise times and greater cross over currents. Thus, the sinusoidal signal generated by clock generator 202 is theorized to be sufficient for a wide variety of state of the art VLSI devices.

In some cases, the $C_{LOAD}$ of clock drive logic 204 is insufficient for the desired clock signal frequency. In other cases, $C_{LOAD}$ may vary with time. To compensate for these possibilities, an embodiment of clock generator 202 depicted in FIG. 5 incorporates a "designed-in" capacitor to supplement and/or stabilize the load capacitance. In the dual phase implementation of FIG. 5, clock generator 202 includes a first capacitor 230 connected between the CLOCK BAR signal output and ground and a second capacitor 232 connected between the CLOCK signal output and ground. In one embodiment, the capacitance of capacitors 230 and 232 is variable controllable and the generator is configured to vary the capacitance of capacitors 230 and 232 to offset variations in the load capacitance $C_{LOAD}$ and thereby maintain a substantially constant overall capacitance.

Figure 2:
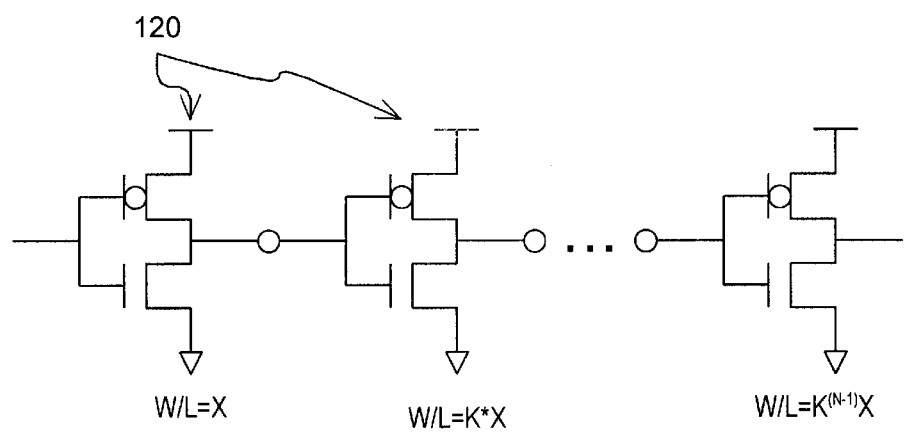
FIG. 2 is a block diagram of selected elements of the clock generator of FIG. 1 emphasizing the generator's buffers.

By directly connecting the clock generator output nodes 220 and 222 to clock driven logic 204, the generator is implemented without buffering circuits such as the exponential horn described previously in regards to FIG. 1 and FIG. 2. In addition to saving valuable real estate on integrated circuit 200, the elimination of buffering circuit beneficially results in a potentially dramatic reduction in power consumption associated with clock signal generation, which is a significant portion of the power required of the device as a whole. With traditional buffering in a conventional LC circuit (e.g., a series of increasingly large CMOS inverters), all of the energy transferred from clock generator energy storage elements is dissipated to ground in the inverters. Each cycle, the clock generator is required to draw sufficient current to charge itself. In contrast, the clock generator 202 depicted in FIG. 4 beneficially "recycles" energy. Each clock cycle, stored energy in inductors 214 is transferred to the capacitive loading of clock driven logic 204 and back to the inductors. Thus, the only current required from current source 210, once the LC circuit is charged, is the current required to compensate for inevitable lossy elements within the device.

Figure 6:
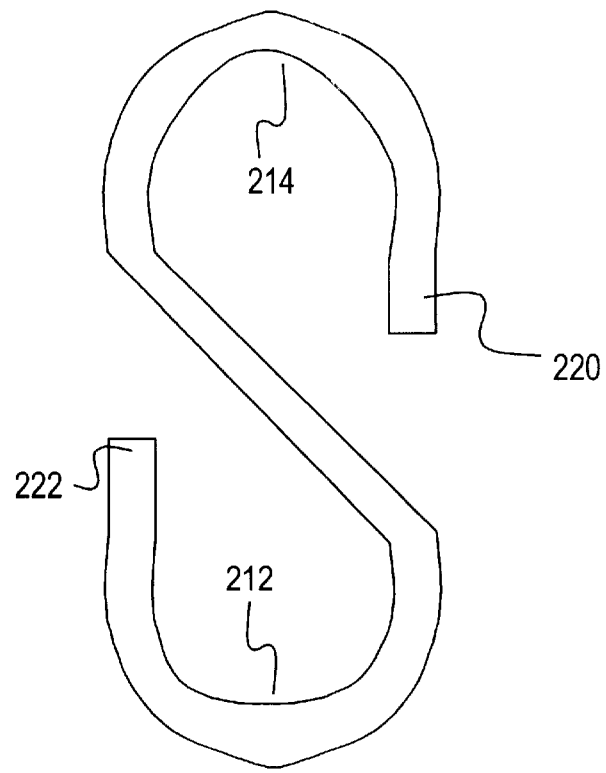
FIG. 6 is a top view of an embodiment of an inductor pair suitable for use in the circuits of FIG. 4 or FIG. 5.

Moreover, as VLSI devices have progressed into the Gigahertz domain, requirements on the sizes of L and C have decreased sufficiently to enable the implementation of inductors 212 and 214 that are well within the manufacturing capability of conventional processing and that do not consume an excessively large area. Inductors in the nano-Henry range having a Q of approximately 5 to 15 can be fabricated in conventional, multi-layer metal CMOS fabrication processing. Inductors 216 and 218 are typically fashioned in some form of loop or spiral. Referring to FIG. 6, a top view of one embodiment of inductors 216 and 218 is depicted. In this embodiment, the inductor pair is achieved on a single layer of metal, typically the top level metal. Whereas multi-level inductor design are capable of conserving die area, the single level embodiment depicted in FIG. 6 typically has a superior Q value to multi-level designs, which suffer from inter-layer leakage. In addition, the S-shaped configuration depicted represents a structure in which the magnetic field induced by first inductor 216 counteracts the magnetic field induced by second conductor 218 thereby further improving the Q factor of both inductors.

Figure 5:
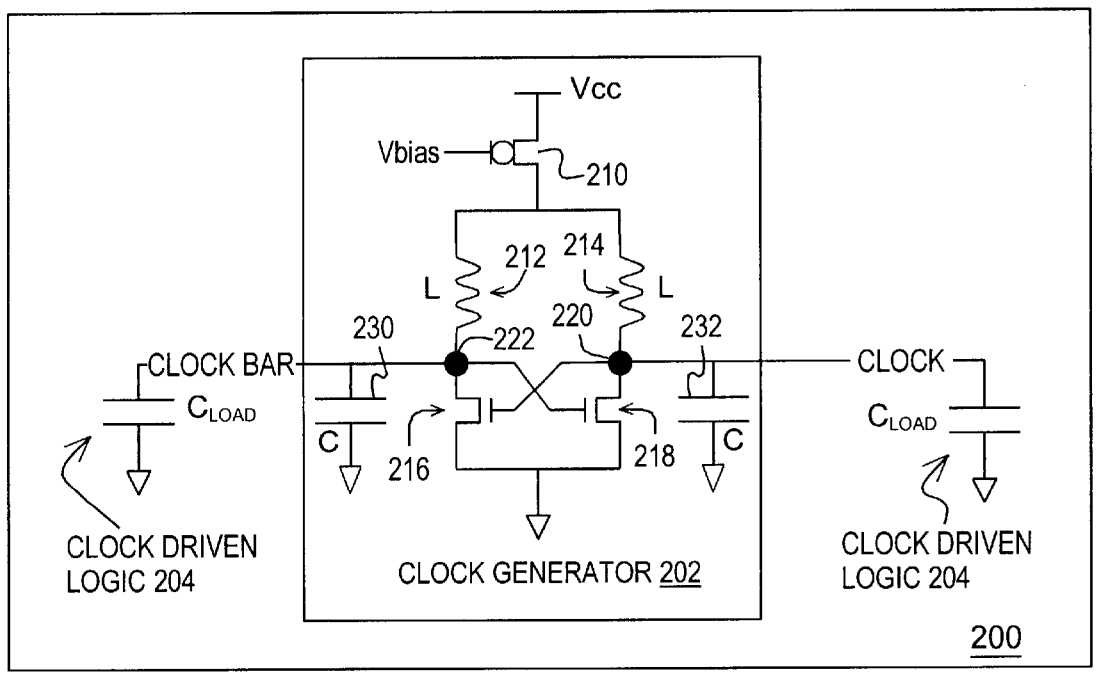
FIG. 5 is a circuit diagram of the clock generator of FIG. 3 according to a second embodiment of the invention.
Figure 7:
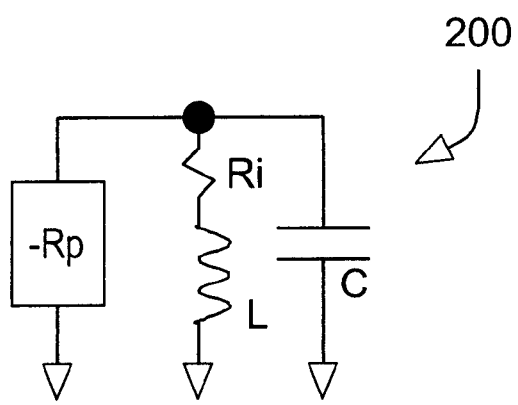
FIG. 7 is an equivalent circuit schematic of an integrated circuit according to the present invention.

The embodiments of integrated circuit 200 depicted in FIG. 4 and FIG. 5 are specific implementations of the equivalent circuit depicted in FIG. 7. As depicted in FIG. 7, integrated circuit 200 according to the present invention includes an inductive element L, which represents the on-chip inductor described previously, a capacitive element, which includes the inherent capacitance of the clock-driven circuitry as well as any designed-in or discrete capacitor(s), and two resistive elements Ri and –Rp. Ri represents the parasitic resistance of the inductive element L while the negative resistance –Rp represents circuitry that is added to compensate for parasitic losses in Ri. In the embodiments of integrated circuit 200 depicted in FIG. 4 and FIG. 5, the negative resistance element –Rp includes the biased p-channel current source and the cross-coupled n-channel transistors. One skilled in the art will recognize that alternative implementations could include, for example, a gate-biased n-channel current source connected between ground and the cross-coupled transistor pair.

It will be apparent to those skilled in the art having the benefit of this disclosure that the present invention contemplates an integrated circuit having an on-chip clock generator that makes beneficial use of the load capacitance as an energy storage element suitable for generating a clock signal in conjunction with a solid state inductor. It is understood that the form of the invention shown and described in the detailed description and the drawings are to be taken merely as presently preferred examples. It is intended that the following claims be interpreted broadly to embrace all the variations of the preferred embodiments disclosed.

What is claimed is:
1. An integrated circuit device, comprising:
   clock driven logic having a load capacitance; and
   a clock generator circuit configured to produce a clock signal that is provided to the clock driven logic wherein the clock generator circuit includes an inductive element connected to a current source, the inductive element including a node connected directly to the clock driven logic such that the frequency of the clock signal depends upon the load capacitance.

2. The integrated circuit device of claim 1, wherein the clock generator circuit includes a designed-in capacitive element in parallel with the load capacitance such that the frequency of the clock signal is a function of the load capacitance and the capacitance of the designed-in capacitive element.

3. The integrated circuit device of claim 2, wherein the capacitance of the designed-in capacitive element is controllably variable.

4. The integrated circuit device of claim 3, wherein the capacitance of the designed-in capacitive element is controlled to offset variations in the load capacitance.

5. The integrated circuit device of claim 1, further comprising a second inductive element connected to the current source, wherein a node of the second inductive element is connected to a second output terminal carrying a second output signal, the second output terminal being directly connected to the clock driven logic.

6. The integrated circuit device of claim 5, further comprising a pair of cross-coupled transistors connected between ground and the first and second output terminals, respectively, wherein the first output signal drives a gate of a second of the cross-coupled transistors while the second output signal drives a gate of a first of the cross-coupled transistor such that the first and second output signals are out of phase with one another.

7. The integrated circuit device of claim 6, wherein the first and second output signals are 180 degrees out of phase.

8. The integrated circuit device of claim 5, wherein the first and second inductive elements are implemented as a single "S" shaped conductive element in a metal layer of the semiconductor device.

9. The integrated circuit device of claim 1, wherein the current source comprises a biased p-channel transistor connected between a voltage source and the inductive element.

10. A clock generator for use in an integrated circuit device having clock driven logic with a characteristic load capacitance, wherein the clock generator is configured to produce a clock signal that is provided to the clock driven logic and further wherein the clock generator circuit includes an inductive element connected to a current source, the inductive element including a node connected directly to the clock driven logic such that the frequency of the clock signal depends upon the load capacitance.

11. The clock generator of claim 10, wherein the clock generator circuit includes a designed-in capacitive element in parallel with the load capacitance such that the frequency of the clock signal is a function of the load capacitance and the capacitance of the designed-in capacitive element.

12. The clock generator of claim 11, wherein the capacitance of the designed-in capacitive element is controllably variable.

13. The clock generator of claim 12, wherein the capacitance of the designed-in capacitive element is controlled to offset variations in the load capacitance.

14. The clock generator of claim 10, further comprising a second inductive element connected between the current source and a second output terminal carrying a second output signal, the second output terminal being directly connected to the clock driven logic.

15. The clock generator of claim 14, further comprising a pair of cross-coupled transistors connected between ground and the first and second output terminals, respectively, wherein the first output signal drives a gate of a second of the cross-coupled transistors while the second output signal drives a gate of a first of the cross-coupled transistor such that the first and second output signals are out of phase with one another.

16. The clock generator of claim 15, wherein the first and second output signals are 180 degrees out of phase.

17. The clock generator of claim 14, wherein the first and second inductive elements are implemented as a single "S" shaped conductive element in a metal layer of the semiconductor device.

18. The clock generator of claim 10, wherein the current source comprises a biased p-channel transistor connected between a voltage source and the inductive element.

19. The clock generator of claim 10, wherein the frequency of the output signal exceeds 1 Gigahertz.

* * * * *